(12) United States Patent
Obata

(10) Patent No.: US 9,297,833 B2
(45) Date of Patent: Mar. 29, 2016

(54) RHODIUM ALLOY HAVING EXCELLENT HARDNESS, PROCESSABILITY AND ANTIFOULING PROPERTIES AND SUITABLE FOR WIRE ROD FOR PROBE PINS

(75) Inventor: Tomokazu Obata, Kanagawa (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 295 days.

(21) Appl. No.: 13/994,564

(22) PCT Filed: Feb. 3, 2012

(86) PCT No.: PCT/JP2012/052450
§ 371 (c)(1),
(2), (4) Date: Jun. 14, 2013

(87) PCT Pub. No.: WO2012/108338
PCT Pub. Date: Aug. 16, 2012

(65) Prior Publication Data
US 2013/0271173 A1    Oct. 17, 2013

(30) Foreign Application Priority Data
Feb. 8, 2011   (JP) .................. 2011-024540

(51) Int. Cl.
G01R 1/067 (2006.01)
C22C 5/00 (2006.01)
C22C 5/04 (2006.01)
C22F 1/14 (2006.01)
C22C 1/02 (2006.01)

(52) U.S. Cl.
CPC .............. *G01R 1/06755* (2013.01); *C22C 1/02* (2013.01); *C22C 5/00* (2013.01); *C22C 5/04* (2013.01); *C22F 1/14* (2013.01)

(58) Field of Classification Search
CPC ... G01R 3/00; G01R 1/07342; G01R 1/06711
See application file for complete search history.

(56) References Cited

U.S. PATENT DOCUMENTS

| | | | |
|---|---|---|---|
| 6,555,764 B1 * | 4/2003 | Maruyama et al. | 174/267 |
| 2006/0197542 A1 | 9/2006 | Tanaka | 324/755.11 |
| 2007/0005294 A1 * | 1/2007 | Andarawis et al. | 702/155 |
| 2007/0240995 A1 * | 10/2007 | Odagawa et al. | 205/183 |
| 2013/0321016 A1 * | 12/2013 | Hirakawa et al. | 324/755.01 |

FOREIGN PATENT DOCUMENTS

| | | |
|---|---|---|
| JP | 4-323339 | 11/1992 |
| JP | H05-154719 | 6/1993 |
| JP | H10-038922 | 2/1998 |
| JP | 2004-093355 | 3/2004 |
| JP | 2005-233967 | 9/2005 |
| JP | 2008-19487 | 1/2008 |

* cited by examiner

*Primary Examiner* — Tung X Nguyen
*Assistant Examiner* — Dominic Hawkins
(74) *Attorney, Agent, or Firm* — Roberts & Roberts, LLP

(57) ABSTRACT

The present invention is a rhodium alloy suitable for wire for a probe pin, the rhodium alloy comprising 30 to 150 ppm of Fe, 80 to 350 ppm of Ir and 100 to 300 ppm of Pt as additive elements, and the balance being Rh. A probe pin composed of the material maintains processability of rhodium, has stable contact resistance even at a low contact pressure, and has excellent strength and antifouling properties, and therefore, can be used in a stable manner for a long period.

4 Claims, 1 Drawing Sheet

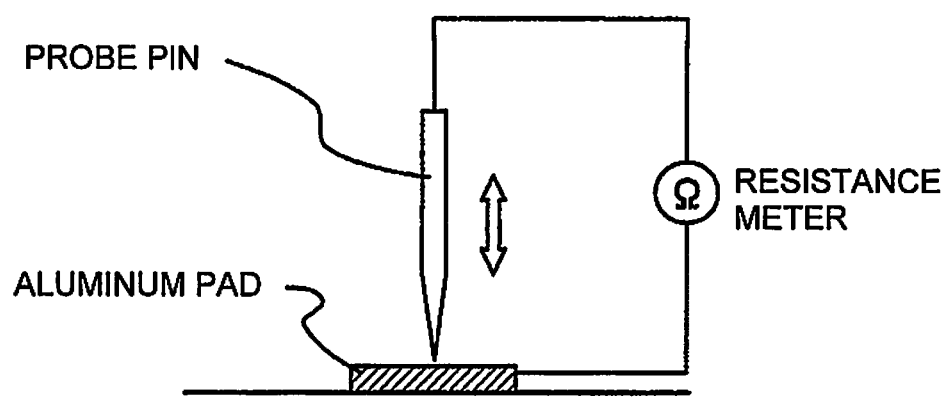

RHODIUM ALLOY HAVING EXCELLENT HARDNESS, PROCESSABILITY AND ANTIFOULING PROPERTIES AND SUITABLE FOR WIRE ROD FOR PROBE PINS

FIELD OF THE INVENTION

The present invention relates to a rhodium alloy suitable for wire rod constituting a probe pin for testing electric properties of semiconductor integrated circuits or the like.

BACKGROUND ART

Electric properties of semiconductor integrated circuits or the like are tested with a probe pin brought into contact with a large number of electrode pads thereof. Constituent materials of a probe pin are required to have various properties such as hardness for ensuring abrasion resistance for the test repeated several million times, oxidation resistance for preventing contamination of test objects caused by the generation of oxidation film, and low specific resistance for improving signal delay.

Copper alloy such as beryllium copper and phosphor bronze, tungsten and palladium alloy or the like have long been known as a material for a probe pin. However, these conventional materials do not have all required properties. For example, copper alloy and tungsten have sufficient mechanical properties but are relatively easily oxidized, and palladium alloy has good oxidation resistance but may be slightly inferior in hardness or the like.

PRIOR ART

Patent Documents

Patent Document 1: Japanese Patent Application Laid-Open No. 10-038922
Patent Document 2: Japanese Patent Application Laid-Open No. 05-154719
Patent Document 3: Japanese Patent Application Laid-Open No. 2004-093355

Thus, as a novel constituent material of a probe pin, a material composed of precious metal such as iridium as a main component has been attracting attention. Iridium is a metal which has, for example, excellent oxidation resistance and electric properties and has sufficient hardness, and therefore, is suitable for a material of a probe pin that is subjected to repeated contact.

SUMMARY OF THE INVENTION

Problems to be Solved by the Invention

When precious metal such as iridium is used for a probe pin, its processability would become a problem. Since pitches between electrode pads tend to be narrower in recent semiconductor integrated circuits due to higher density, the wire diameter of a probe pin in required to be fine. In this regard, precious metal, particularly iridium, has high hardness, and therefore is difficult to be formed into fine wire and is often broken during processing, and therefore, may not meet the requirement.

The present invention has been made under such circumstances, and provides a precious metal alloy suitable for a probe pin, having good processability that allows miniaturization, excellent hardness and antifouling properties, while processability is ensured.

Solution to Problem

The present inventor has conducted intensive studies to solve the above problem and has arrived at the use of precious metal rhodium (Rh) having better processability than iridium. However, rhodium is inferior in hardness, and therefore, it is not preferable to use rhodium for a probe pin in its pure metal form. Thus, the present inventor has found an alloy which comprises rhodium as a main component and a plurality of additive elements added in small amounts and which has improved hardness or the like, while the processability of rhodium is maintained, and have accomplished the present invention.

Accordingly, the present invention is a rhodium alloy suitable for wire for a probe pin, the rhodium alloy comprising 30 to 150 ppm of Fe, 80 to 350 ppm of Ir and 100 to 300 ppm of Pt as additive elements, and the balance being Rh.

As described above, in the invention of the present application, three additive elements of iron (Fe), iridium (Ir) and platinum (Pt) are added to rhodium. For the significance of adding these additive elements, Fe is added to improve processability, Ir is added to improve mechanical strength and Pt is added to improve oxidation resistance. It is necessary to add the three additive elements simultaneously and all is essential.

The concentrations of the respective additive elements range as described above. This is to demonstrate the hardness and antifouling properties while the processability of Rh is maintained. The concentrations of the additive elements are more preferably 50 to 100 ppm of Fe, 150 to 350 ppm of Ir and 150 to 300 ppm of Pt.

The rhodium alloy according to the present invention can be formed into wire for a probe pin by producing an ingot comprising a rhodium alloy of a predetermined composition to which the additive elements are added, and by subjecting the ingot to wire processing. For the casting of the alloy, since the casting is for a high melting point material such as rhodium and iridium, a casting method with high energy density, such as arc melting or high frequency melting, is employed. The concentrations of the respective additive elements are adjusted in the casting, and for the form of raw materials, those in the form of powder or small mass may be used at this time. For processing the ingot after alloy casting into a bar, hot forging and hot rolling are employed, and may be repeated. Subsequently, the bar is processed into fine wire from a rough-worked wire. For processing into a rough-worked wire, after annealing the bar appropriately, hot processing (swaging, drawbenching) is carried out. Also, for fine wire processing, hot wire drawing, more specifically, wire drawing under heat by electric current application may be employed. The wire drawing under heat by electric current application means wire drawing in which wire to be processed is passed through a die and a pressure roller. Electric current is applied to the wire to be processed from outside and the resistance heat at that time is used as a heat source for ensuring processability. The wire drawing under heat by electric current application enables homogeneous heating at high temperatures by adjusting the current to be applied, and is capable of processing rhodium alloy having high high-temperature strength relatively easily.

Advantageous Effects of Invention

The rhodium alloy according to the present invention described above has more excellent processability than iridium that has been a promising material for a probe pin. The rhodium alloy also has comparable hardness and antifouling properties or the like.

A probe pin composed of the rhodium alloy according to the present invention has excellent durability and antifouling properties, and therefore, can be used for a test of electric properties of semiconductor integrated circuits or the like for a long period. It is preferable that the probe pin is composed of so-called a solid material only, which is the rhodium alloy according to the present invention. This is because, although a probe pin with rhodium alloy formed only on the surface via plating or cladding may also be used, in such cases the strength of the tip portion of the probe pin may be decreased during use and the alloy may peel off from the base material, while the solid material does not suffer from such problems.

BRIEF DESCRIPTION OF THE DRAWING

FIG. 1 A view illustrating the constitution of a simulator for evaluating antifouling properties.

DETAILED DESCRIPTION OF THE PREFERRED EMBODIMENT

Hereinafter a preferred embodiment of the present invention will be described. In this embodiment, Rh alloys in which the amounts of Fe, Ir and Pt to be added were appropriately changed were produced, and the resulting alloys were formed into wire for study into whether they are processable or not.

Pure rhodium powder and metal powder of the respective additive elements were weighed and mixed in a predetermined composition, and the mixture was arc-melted to produce a bar-shaped rhodium alloy ingot. The bar-shaped ingot was hot forged at 1000 to 1200° C. to prepare a 12 mm square bar. Then the bar was hot rolled with a grooved pressing roll (temperature 900 to 1100° C.) to prepare a 5 mm square wire. Further, hot swaging and drawbenching were performed several times to form a rough-worked wire having a wire diameter of 1.33 mm.

The rough-worked wire was drawn to a fine wire with a device for wire drawing under heat by electric current application. In the device for wire drawing under heat by electric current application, a rough-worked wire is fed from a feed roll and drawn after being passed through a die. At this time, by applying electric current to the feed roll and the die which serve as electrodes, the rough-worked wire is heated with the electric current application. In this embodiment, processing conditions included a current of 9 to 11 mA and a feed rate of 2 to 6 m/min. Also, carbon powder was applied to the wire immediately after the feed roll. Finally, cold wire drawing was carried out to prepare wire having a wire diameter of 60 μm as a final product.

In this embodiment, the processability in the above wire processing step was evaluated, the hardness of the wire produced was measured, and the antifouling properties of the wire were evaluated. For the evaluation of the processability, the number of times when the wire broke during the production of 1 lot of the wire (total length 300 m) in the above processing step was recorded. Also, for the measurement of hardness, the surface hardness of the wire was measured with a Vickers hardness meter. Further, the antifouling properties were evaluated with the simulator shown in FIG. 1. In the simulation, the probe pin produced was set at the simulator and the electric resistance was measured while the probe pin was repeatedly brought into contact with the pad under the following conditions. In the simulation, the electric resistance increased in proportion to the increase in the number of contacts, and the time when the electric resistance exceeded 5Ω was determined to be the time when cleaning for contamination is necessary, and the number of contacts before the time was measured. The measurement results of the number of contacts until the contact resistance exceeded 5Ω are shown in Table 1.

Simulation Conditions
  Object to contact: aluminum pad
  Contact pressure: 8 g/1 pin
  Current applied: 100 mmA/1 pin

TABLE 1

| | Composition (ppm) | | | | Evaluation of properties | | |
| --- | --- | --- | --- | --- | --- | --- | --- |
| | | | | | Hardness | | Antifouling |
| No. | Fe | Ir | Pt | Rh | (Hv) | Processability | properties |
| 1 | 50 | 150 | 150 | Balance | 480 | ○ | ○ |
| 2 | 70 | 200 | 200 | Balance | 500 | ⊙ | ⊙ |
| 3 | 50 | 200 | 250 | Balance | 490 | ○ | ⊙ |
| 4 | 100 | 250 | 200 | Balance | 500 | ⊙ | ⊙ |
| 5 | 100 | 350 | 300 | Balance | 510 | ⊙ | ⊙ |
| 6 | 10 | 50 | 50 | Balance | 450 | XX | XX |
| 7 | 10 | 70 | 100 | Balance | 467 | X | X |
| 8 | 70 | 600 | 200 | Balance | 530 | X | ○ |
| 9 | 50 | 200 | 10 | Balance | 485 | X | X |
| 10 | 50 | 400 | 200 | Balance | 515 | Δ | ○ |
| 11 | 70 | 400 | 200 | Balance | 513 | Δ | ○ |
| 12 | 70 | 400 | 80 | Balance | 507 | Δ | X |
| 13 (Pure Rh) | — | — | — | 100% | 470 | ⊙ | XX |
| 14 (Pure Ir) | — | 100% | — | — | 720 | Δ | ⊙ |

Processability  ⊙: The number of times when the wire broke during production is 0.
○: The number of times when the wire broke during production is once.
Δ: The number of times when the wire broke during production is twice.
X: The number of times when the wire broke during production is three times.
XX: The number of times when the wire broke during production is more than three times.

TABLE 1-continued

| | |
|---|---|
| Antifouling properties | ⊚: The number of contacts until cleaning becomes necessary is 1.6 million times or more.<br>◯: The number of contacts until cleaning becomes necessary is about 1.2 million times to less than 1.6 million times.<br>Δ: The number of contacts until cleaning becomes necessary is 800 thousand times to less than 1.2 million times.<br>X: The number of contacts until cleaning becomes necessary is 400 thousand times to less than 800 thousand times.<br>XX: The number of contacts until cleaning becomes necessary is less than 400 thousand times. |

Table 1 shows the results of the evaluation of each property. As described above, the respective additive elements Fe, Ir and Pt are added to improve each property including processability, mechanical strength and oxidation resistance (antifouling properties). In this regard, the effect of increasing the hardness of the alloy by the addition of Ir can be found. Also, the processability and the antifouling properties are good. However, inadequate or excessive addition of the additive elements causes decrease in some or all properties, and this shows that it is necessary to adjust the composition properly.

INDUSTRIAL APPLICABILITY

As described above, the wire for a probe pin according to the present invention has reliable processability, and therefore, enables finer wire production and higher strength which are difficult to be achieved with iridium. According to the present invention, a probe pin with narrower pitches can be produced and its stable properties can be maintained even in environment of use subjected to repeated friction.

What is claimed is:

1. A probe pin comprising a rhodium alloy, the rhodium alloy comprising: 30 to 150 parts per million of iron, 80 to 350 parts per million of iridium, and 100 to 300 parts per million of platinum as additive elements, said parts being based on the parts of rhodium in the rhodium alloy.

2. A The probe pin defined in claim 1 which has a wire shape.

3. A probe card having the probe pin defined in claim 1.

4. A probe card having the probe pin defined in claim 2.

* * * * *